US 6,592,831 B2

United States Patent
Hwu et al.

(10) Patent No.: US 6,592,831 B2
(45) Date of Patent: Jul. 15, 2003

(54) VAPORIZATION AND CRACKER CELL METHOD AND APPARATUS

(75) Inventors: Ruey-Jen Hwu, Salt Lake City, UT (US); Laurence P. Sadwick, Salt Lake City, UT (US); Paul P. Lee, Salt Lake City, UT (US)

(73) Assignee: Technology Transfer Office, The University of Utah, Salt Lake City ( * ) Notice: Subject to any disclaimer, the term of this patent is extended or adjusted under 35 U.S.C. 154(b) by 0 days.

(21) Appl. No.: 10/192,105

(22) Filed: Jul. 10, 2002

(65) Prior Publication Data

US 2002/0182885 A1 Dec. 5, 2002

Related U.S. Application Data

(62) Division of application No. 09/241,805, filed on Feb. 2, 1999, now Pat. No. 6,447,734.

(51) Int. Cl.[7] ............................................. C23C 14/00
(52) U.S. Cl. ..................... 423/87; 423/299; 423/322; 427/248.1; 427/250; 427/255; 117/108; 392/387; 118/726; 422/129
(58) Field of Search ................. 118/726, 719, 118/724; 422/129; 250/251; 427/248.1, 250, 255.395, 255.38; 117/108; 392/387, 389, 393; 423/299, 322, 87

(56) References Cited

U.S. PATENT DOCUMENTS

| 4,606,296 A | 8/1986 | Gailliard et al. |
| 4,607,152 A | 8/1986 | Allovon et al. |
| 5,080,870 A | 1/1992 | Streetman et al. |
| 5,156,815 A | 10/1992 | Streetman |
| 5,298,759 A | 3/1994 | Brewer et al. |
| 5,321,260 A | 6/1994 | Goldstein et al. |
| 5,433,791 A | 7/1995 | Brewer et al. |
| 5,542,979 A | 8/1996 | Matsuno |
| 6,030,458 A | 2/2000 | Colombo et al. |

OTHER PUBLICATIONS

Parker, The Technology and Physics of Molecular Beam Epitaxy, Plenum Press, New york, 1985, pp. 16 and 17.*
Lee et al., *Epitaxial Growth and Characterization of DyP/GaAs, and GaAs/DyP/GaAs Heterostructure*, J. Electronic Material, vol. 27, No 5, pp. 405–408, May 1998.

(List continued on next page.)

*Primary Examiner*—Richard Bueker
(74) *Attorney, Agent, or Firm*—Workman Nydegger Seeley

(57) ABSTRACT

A method and apparatus for vaporizing and cracking chemical elements for use in a deposition process. The apparatus includes a vaporization cell integrally connected with a thermal cracker cell. The vaporization cell has an inlet section in communication with a valve section defining a heating chamber capable of holding a liquid or solid chemical material to be vaporized. A heat source is positioned in the heating chamber and is capable of providing sufficient thermal energy to evaporate or sublimate the chemical material. The thermal cracker cell is communicatively connected to an outlet of the vaporization cell, and includes an elongated tapered tube with a heating element associated therewith. The heating element is capable of providing sufficient thermal energy to dissociate molecular clusters of vaporized chemical material. This provides monomeric or dimeric chemical elements for use in a deposition process such as during semiconductor device fabrication.

19 Claims, 2 Drawing Sheets

OTHER PUBLICATIONS

Lee et al., *Growth and Characterization of DyP/GaAs and DyAs/Ga/As–based Heterostructures and Superlattices, Physica E2*, pp. 358–362, 1998.

Lee et al., *Molecular Beam Epitaxy Growth and Characterization of DyP/GaAs, DyAs/GaAs, GaAs/DyP/GaAs, and GaAs/DyAs/GaAs Heterostructures, J. Vacuum Science & Technology B*, vol. 16, No. 3, pp. 1467–1470, May 1998.

Lee et al., *High Temperature Characterization of MBE Grown DyP/GaAs and DyAs/GaAs, High Temperature Electronics Conference Proceedings*, 1998.

Cracking Cells, EPI MBE Products Group, http://www.epimbe.com/components/cracker.htm, Oct. 1998.

P Valved Cracker, EPI MBE Products Group, http://www.epimbe.com/components/vc–p.htm, Oct. 1998.

* cited by examiner

VAPORIZATION AND CRACKER CELL METHOD AND APPARATUS

This is a divisional application of U.S. patent application Ser. No. 09/241,805, filed on Feb. 2, 1999, now U.S. Pat. No. 6,447,734 B1, which is incorporated herein by reference.

The U.S. Government has a paid-up license in this invention and the right in limited circumstances to require the patent owner to license others on reasonable terms as provided for by the terms of Grant No. ECS-9502891 awarded by the National Science Foundation (NSF).

BACKGROUND OF THE INVENTION

1. The Field of the Invention

The present invention relates generally to an apparatus and method for transforming chemical elements from a solid state to a gaseous state. More specifically, the present invention relates to an apparatus and method for vaporizing and cracking chemical elements for use in a deposition process such as during semiconductor device fabrication.

2. The Relevant Technology

Various chemical elements are used in conventional deposition processes performed during semiconductor device fabrication. For example, the chemical elements in Group V of the periodic table, such as phosphorus and arsenic, are commonly used as dopants in semiconductor processing technologies and are vital materials in several semiconductor devices. It is desirable to be able to convert the solid forms of these chemical elements into a form which may be subsequently combined with other chemical elements to create the desired product. To accomplish this, the chemical elements must first be vaporized.

Conventional techniques for converting chemical elements into vapor phase for semiconductor device fabrication employ a vacuum evaporation system. Generally, the vacuum evaporation system includes a heating unit and is in communication with a growth chamber for deposition of the element onto a substrate. The heating unit is used to supply the required energy to convert the element into a vaporous form, and the growth chamber is ideally operated under high vacuum conditions, as this ensures a high quality, non-contaminated crystal. One technique that employs such a vacuum evaporation system is molecular-beam epitaxy (MBE).

In MBE, a variety of sources can be employed for flux generation, and their design depends on the nature of source materials. The thermal effusion source or Knudsen-cells (k-cells) are used in nearly all MBE systems for deposition of semiconductor and/or dopant materials during semiconductor device fabrication. A k-cell includes a crucible containing a solid or liquid evaporant, which is radiatively heated by electrically insulated heater filaments wound around the crucible. A thermocouple, which is carefully positioned to ensure intimate contact with the crucible, registers the source material temperature and can, via a feed-back loop, control the power to the heater and thus the temperature of the source. Several layers of refractory metal foil (e.g., tantalum) are wrapped around the entire cell to minimize heat losses from the cell wall, with the major heat loss being from the effusion aperture.

Typically, the vaporization process yields varying ratios of chemical elements in monomeric, dimeric, and tetrameric forms. Conventional vaporization techniques for group V elements are unable to reduce the majority of the element to a monomeric or dimeric form, resulting in a substantial amount of tetrameric forms of the element. Such tetrameric forms of group V elements are undesirable from the standpoint of use in semiconductor device fabrication. The growth of a crystalline layer, which is required for semiconductor device applications, is best achieved when the monomeric (atomic) or the dimeric form of the element is used. Therefore, after vaporization of the chemical element, a method to efficiently convert clusters of tetrameric forms of the element into monomeric and dimeric forms is of substantial interest.

Several techniques for converting or "cracking" tetrameric forms of chemical elements into monomeric or dimeric forms have been developed. Such techniques employ either extremely high temperatures or ultraviolet light to input the energy necessary to separate elemental clusters. Some of these systems, such as the ultraviolet light systems, are very mechanically complex with many small parts requiring continual adjustments in order to achieve optimal performance. For example, precise alignment of parts is necessary to focus an ultraviolet beam in a manner that will achieve efficient cracking of elemental clusters.

The disadvantages of cracking systems that employ extreme heat or ultraviolet light include the high maintenance and expense required to run and maintain such systems. The high expense is incurred through both the power consumption and the mechanical maintenance required. In addition, most known systems for evaporating and cracking chemical elements have separate evaporation and cracker cell units, which reduces the efficiency of providing the chemical elements in a desirable form for deposition.

It would therefore be of significant advantage to develop a simple, inexpensive, and efficient system which can perform both the functions of chemical element vaporization and cracking.

SUMMARY AND OBJECTS OF THE INVENTION

It is an object of the present invention to provide an apparatus for vaporizing and cracking chemical elements for use in a deposition process during semiconductor device fabrication.

It is another object of the present invention to provide such a vaporizing and cracking apparatus that is simple in design and manufacture, and inexpensive to use and maintain.

It is another object of the present invention to provide such a vaporizing and cracking apparatus which is a fully integrated or combined effusion system.

It is a further object of the present invention to provide such a vaporizing and cracking apparatus which is easy to use and operates at peak efficiency.

To achieve the foregoing objects, and in accordance with the invention as embodied and broadly described herein, an apparatus is provided for vaporizing and cracking chemical elements such as group V elements for use in a deposition process. The apparatus includes a vaporization cell integrally connected with a thermal cracker cell.

The vaporization cell has an inlet section in communication with a valve section defining a heating chamber capable of holding a chemical material to be evaporated or sublimated. A container such as a quartz boat is preferably disposed in the heating chamber for holding the chemical material. A heat source is positioned in the heating chamber and is capable of providing sufficient thermal energy to evaporate or sublimate the chemical material.

The thermal cracker cell is communicatively connected to an outlet of the vaporization cell, and includes a tapered elongated tube with a heating element such as a heating coil disposed therearound. The heating element is capable of providing sufficient thermal energy to dissociate molecular clusters of vaporized chemical material. This provides monomeric or dimeric chemical elements for use in a deposition process. The elongated tube is preferably composed of quartz and has a passageway with a diameter of a first dimension that narrows to a smaller second dimension toward an exit opening of the tube. The tube narrows in order to cause the gaseous clusters of elements to be separated so that the clusters can receive a greater amount of heat energy as a result of increased exposure to and decreased distance from the heating element. This exposure results in greater efficiency in separating elemental clusters, and allows the use of lower temperatures.

In a method for vaporizing and cracking a chemical material which utilizes the apparatus of the invention, a preselected amount of a chemical material is placed into the heating chamber, and the chemical material is heated to a first temperature sufficient to vaporize the chemical material. The temperature in the heating chamber can be monitored and adjusted for optimal vaporizing conditions. The vaporized chemical material is then directed to the elongated tube and is heated along the smaller second dimension of the passageway in the elongated tube to a higher second temperature sufficient to dissociate molecular clusters of vaporized chemical material. The dissociated chemical material can then be directed from the exit opening of the elongated tube to a vacuum chamber for deposition on a substrate.

These and other objects, features, and advantages of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention briefly described above will be rendered by reference to a specific embodiment thereof which is illustrated in the appended drawings. Understanding that these drawings depict only a typical embodiment of the invention and are not therefore to be considered limiting of its scope, the invention will be described and explained with additional specificity and detail through the use of the accompanying drawings in which.

DETAILED DESCRIPTION OF THE INVENTION

The present invention is directed to an apparatus and method for vaporizing and cracking chemical elements such as group V elements. The invention is particularly useful in deposition processes such as those employed during semiconductor device fabrication. The apparatus of the invention provides an efficient, simple, and economic way of performing both chemical element vaporization and cracking during a deposition process such as MBE.

The apparatus of the invention provides for a two-step heating process in which a chemical material in a solid or liquid state is first vaporized and then further heated to crack or dissociate vaporous molecular clusters into monomeric or dimeric forms of a chemical element. As used herein, the term "monomeric" refers to the atomic form of any element or a single atom of any element unbound to other atoms of the same element, while the term "dimeric" refers to two atoms of any element which are bonded to one another.

Figure 1:
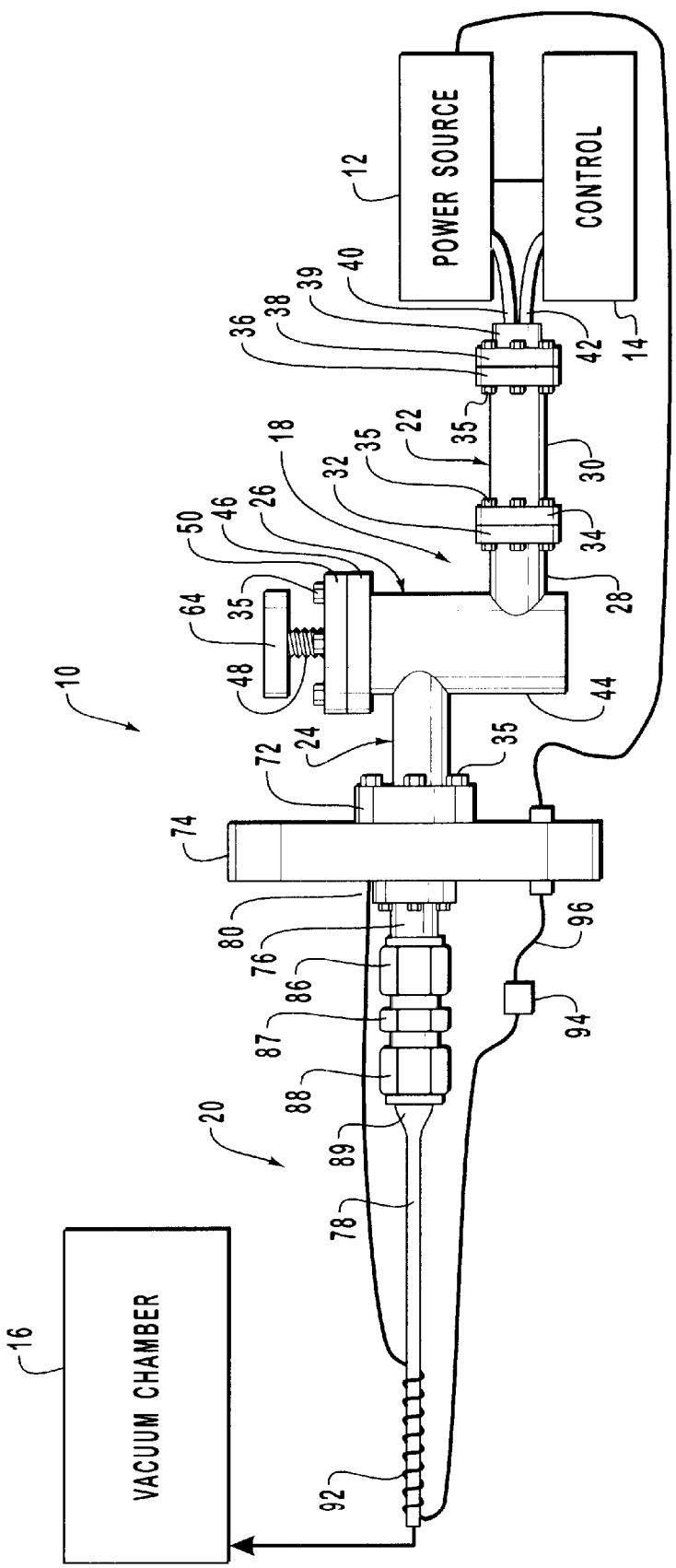
FIG. 1 is a side view of a vaporization and cracker cell apparatus according to the present invention.

Referring to the drawings, wherein like structures are provided with like reference designations, the drawings only show the structures necessary to understand the present invention. FIG. 1 illustrates a vaporization and cracker cell apparatus 10 according to the present invention. The apparatus 10 is shown operatively connected at one end to a power source 12 and a control device 14, which will be discussed in further detail below in connection with the operation of apparatus 10. The outlet end of apparatus 10 is in communication with a vacuum chamber 16 where deposition of a material from apparatus 10 takes place during a fabrication process. The apparatus 10 as a whole can be fitted onto any vacuum chamber by choosing components of appropriate dimension, as fits each individual chamber, and can operate efficiently in vacuum below the millitorr range.

The apparatus 10 includes two subunits, a vaporization cell 18 and a thermal cracker cell 20, which are communicatively attached together in an integral structure. Each of these subunits will be discussed in detail as follows.

Figure 2:
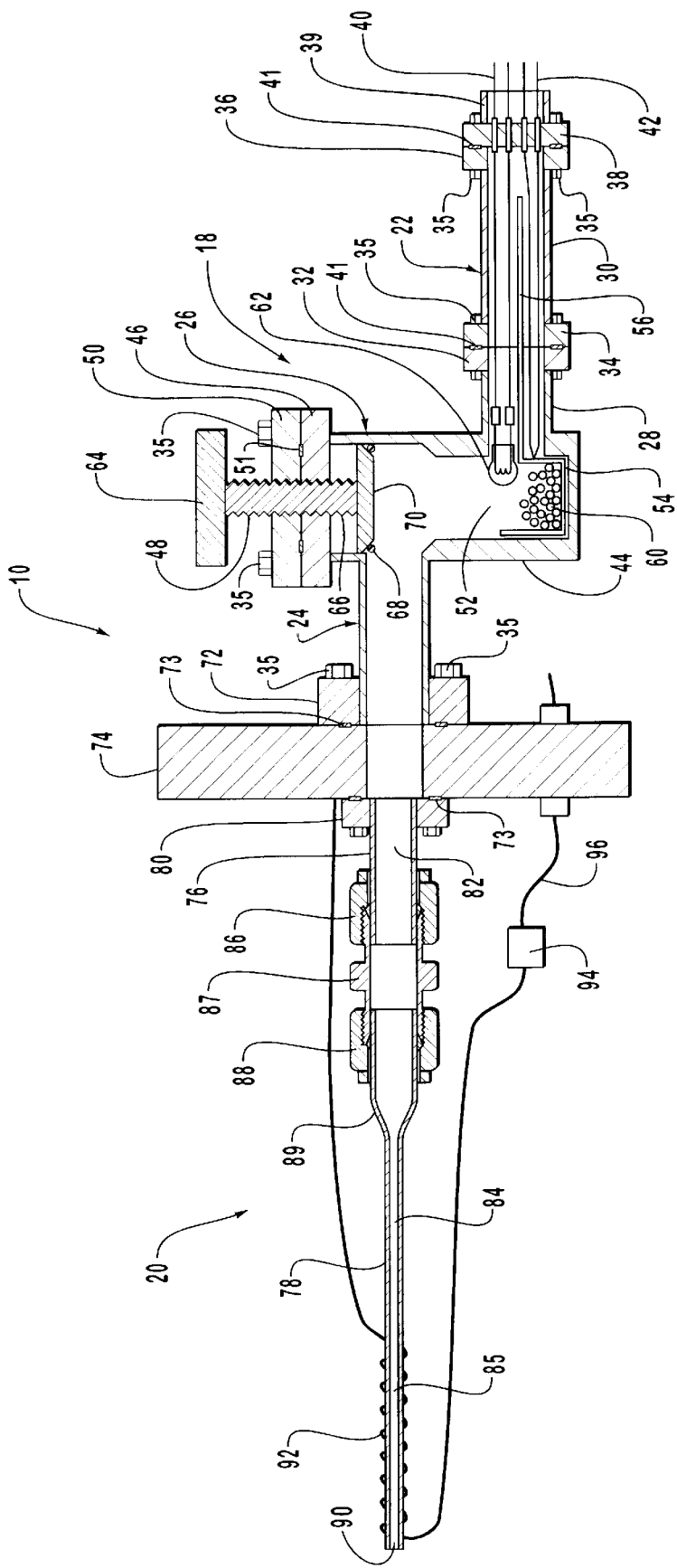
FIG. 2 is a cross-sectional view of the vaporization and cracker cell apparatus of FIG. 1.

As shown in FIGS. 1 and 2, vaporization cell 18 includes an inlet section 22 and an outlet section 24 which are communicatively connected to a valve section 26 therebetween. The inlet section 22, outlet section 24, and valve section 26 are preferably hollow tubular structures which can be formed of various materials such as stainless steel. The inlet section 22 and outlet section 24 are preferably attached on opposite sides of valve section 26 in a parallel configuration perpendicular to valve section 26.

The inlet section 22 has two subsections, including a valve inlet portion 28 and a feedthrough section 30. The valve inlet portion 28 is communicatively connected at one end to valve section 26 and on the other end has a circular connection flange 32. The feedthrough section 30 has a pair of opposing connection flanges 34 and 36 on each end thereof. The connection flange 34 is attached to flange 32 by a plurality of bolts 35 inserted between the flanges to provide for removable attachment of feedthrough section 30 with valve inlet portion 28. The connection flange 36 is removably attached to a feedthrough flange 38 by bolts 35, and the feedthrough flange 38 is removably attached to a smaller guide flange 39. A sealing gasket 41 such as a copper gasket is preferably disposed between each of the attached flanges to provide a vacuum seal. The feedthrough flange 38 and guide flange 39 have openings therein permitting insertion of a power feedthrough 40 and a thermocouple feedthrough 42 into inlet section 22. As shown in FIG. 1, power feedthrough 40 is operatively connected to power source 12, and thermocouple feedthrough 42 is operatively connected to control device 14. The power feedthroughs are individually fitted through the flanges to minimize the size constraints.

The valve section 26 of vaporization cell 18 is preferably an in-line manual valve which includes a tubular section 44 with a circular connection flange 46 and a valve assembly 48 with a connection flange 50. The connection flange 50 is removably attached to connection flange 46 by bolts 35 inserted between the flanges. A sealing gasket 51 such as a copper gasket for vacuum seal is disposed between connection flanges 46 and 50. The tubular section 44 defines a heating chamber 52, which holds a chemical element container 54 such as a quartz boat that serves as a crucible for a chemical material 60 to be evaporated or sublimated. As depicted in FIG. 2, container 54 preferably has a handle 56 which extends into inlet section 22, allowing for easy insertion and removal of container 54 into and from chamber 52. The container 54 is designed to hold a maximum amount of chemical material 60 to be vaporized, in solid or liquid form, without spilling during refill operations.

A heating means is provided such as a heat source 62 for raising the temperature of chemical material 60 to its vaporization temperature. The heat source 62 is positioned in chamber 52 adjacent to container 54 and is operatively connected to power feedthrough 40. The heat source 62 can be provided in the form of a light bulb, a quartz lamp, and the like. For example, a 150 watt light bulb can be placed inside chamber 52 directly above chemical material 60 held in container 54. The thermocouple feedthrough 42, associated with a thermocouple device, is in intimate contact with container 54 through inlet section 22 and registers the temperature of chemical material 60. The thermocouple device can provide, via a feed-back loop, control of the power to heat source 62 and thus the temperature of chemical material 60.

The valve assembly 48, which can be a bellow valve assembly, includes a valve handle 64 connected to a movable bellow section 66 disposed in chamber 52. The bellow section 66 terminates in a valve seat 70 having an o-ring 68 for high temperature seal, such as a Calrez™ o-ring. The handle 64 provides manual control such that below section 66 can be raised and lowered as needed during operation of apparatus 10 in order to open or close chamber 52 with respect to cracker cell 20.

The outlet section 24 includes an outlet connection flange 72 attached to a larger circular connection flange 74 by a plurality of bolts 35 inserted between the flanges to provide for removable attachment of cracker cell 20 to vaporization cell 18. A sealing gasket 73 such as a copper gasket is preferably disposed between flanges 72 and 74.

The thermal cracker cell 20 includes a fitting tube 76 and an elongated heating tube 78 which are in communication with vaporization cell 18. The fitting tube 76 has a tube connection flange 80 that is bolt connected to connection flange 74. A sealing gasket 73 is preferably disposed between flanges 74 and 80. A passageway 82 within fitting tube 76 is in communication with the passageway of outlet section 24. The heating tube 78 defines a passageway 84 and is removably interconnected with fitting tube 76. The fitting tube 76 and heating tube 78 are interconnected by a plurality of tube fittings 86, 87 and 88, which are preferably Swage-Lok metallic fittings, or the like, typically used for low pressure and high temperature applications. The fitting tube 76 interconnects with fitting 86, while heating tube 78 interconnects with fitting 88. The fitting tube 76 is preferably made of a metallic material such as stainless steel, while heating tube 78 is preferably made of a transparent quartz material.

The heating tube 78 defines a first larger diameter for passageway 84 which extends into fitting 88 to accentuate the flow of the vapor from outlet section 24. The heating tube 78 has a tapering section 89 that narrows abruptly such that passageway 84 has a second smaller diameter along the majority of tube 78 which defines a cracker zone 85 therein. The cracker zone 85 is designed to provide for multiple collisions of molecules to maximize the probability of dissociation. The second smaller diameter of passageway 84 extends to an exit opening 90 at the distal end of tube 78 for effusion of the dissociated vaporized material. In one embodiment, the first larger diameter of passageway 84 is about 19 mm and the second smaller diameter is about 4 mm. The passageway 82 in fitting tube 76 and the passageway 84 in heating tube 78 are aligned for easy and efficient passage of gaseous materials from vaporization cell 18 to cracker cell 20.

A heating element such as a heating coil 92 is wrapped around the outside of heating tube 78 toward the distal end thereof along the smaller diameter portion of passageway 84 defining cracker zone 85. The heating coil 92 is electrically connected to power source 12 as shown in FIG. 1 by being coupled at a connection junction 94 with a feedthrough connection 96, which passes through flange 74 for connection with power source 12. The heating coil 92 can be composed of various metallic materials such as refractory metals including tantalum, tungsten, molybdenum, alloys or combinations thereof, and the like. A particularly preferred material for the heating coil is tantalum.

The heating coil 92 is in close proximity to heating tube 78 and provides the thermal energy necessary to cleave elemental molecular clusters passing through tube 78. The narrowed portion of passageway 84 forming cracker zone 85 in tube 78 has the effect of spacing gaseous molecular clusters of elements which provides increased exposure of the molecular clusters to the thermal energy provided by heating coil 92. The narrowed portion in tube 78 also has the effect of bringing molecular clusters in closer proximity to the heat provided by heating coil 92. These effects allow for the cracking of molecular clusters in a more efficient manner and at a lower temperature than in prior cracking devices.

In a method of operating vaporization and cracker cell apparatus 10, a preselected amount of chemical material 60 is placed in container 54, which is inserted into chamber 52 of vaporization cell 18. The connection flange 74 is sealingly attached to a conventional connecting flange (not shown) on an inlet of vacuum chamber 16 by bolt connections such that cracker cell 20 is in communication with vacuum chamber 16. The chemical material 60 is then heated sufficiently to vaporize the chemical material. Typically, the temperature in chamber 52 is in a range from about 250° C. to about 400° C., and preferably about 300° C., in order to vaporize the chemical material. The vaporized material is then directed into cracker cell 20 and is further heated to a cracking temperature by heating coil 92 while passing through cracker zone 85 in heating tube 78 to dissociate molecular clusters. The temperature in cracker zone 85 is in a range from about 700° C. to about 900° C., and preferably about 800° C., in order to dissociate the vaporized material. The dissociated molecules can then be directed to vacuum chamber 16 for deposition on a substrate such as a semiconductor material.

The parameters used in the operation of apparatus 10, such as power, temperature, and pressure, have the capability of being adjusted to achieve the maximum possible yield of the monomeric or dimeric form of a chemical element. Power can be controlled externally by power source 12 and control device 14 such as a computer or other digital control device. The general power consumption for power feedthrough 40 is typically less than about 100 watts for apparatus 10. The temperature is monitored by the thermocouple device and heat source 62 provides the thermal energy for the vaporization of the chemical material. The position of heat source 62 and the amount of power at which it operates are parameters which may be varied in order to achieve optimization for a given element yield. The range of partial pressures utilized during operation of apparatus 10 can be up to about $5 \times 10^{-4}$ torr, and preferably from about $1 \times 10^{-5}$ torr to about $1 \times 1^{-4}$ torr. Optimization runs for apparatus 10 can be carried out with the aid of a residual gas analyzer (RGA) to determine the optimal parameters for a given chemical element yield.

During operation of apparatus 10, it is preferred that no thermal interaction occur between vaporization cell 18 and thermal cracker cell 20. This prevents loss of control over vaporization when cracker cell 20 is operated. The chemical material container 54 generally only needs to be refilled every few months, depending on the operation frequency of apparatus 10.

The apparatus of the present invention is particularly effective in vaporizing and cracking group V chemical elements such as phosphorus, arsenic, antimony, and combinations thereof. For example, the apparatus of the invention can be used to convert a solid phosphorus source ($P_4$) such as red phosphorus to its vapor phase, and then to crack the vaporous phosphorus to obtain varying ratios of $P_3$, $P_2$, and P. The apparatus of the invention provides effective control over the generation of a vapor such as a phosphor gas. The ratios of the desired final product with respect to $P_3$, $P_2$, or P, can be adjusted by varying the temperature of the heating coil around the quartz tube, and the rate at which the vapor passes through the quartz tube, depending on the requirement for a given application. The control of the power for the vaporization cell and the cracker cell can provide extremely stable partial pressures of phosphorus, with almost no noticeable fluctuations.

When arsenic is vaporized and cracked by the apparatus of the invention, it is preferable to provide an additional heat source at various points around apparatus 10 to prevent condensation of the arsenic. For example, a high condensation rate of the arsenic flux can occur at the in-line valve. The additional heat source can be in the form of conventional heating tape which can be wrapped around selected outside portions of apparatus 10.

The apparatus of the present invention provides many advantages and benefits. The apparatus is a fully integrated or combined effusion system of vaporization and cracker cells, has a simple design, and is easy to manufacture and use. The apparatus provides an effective effusion system which combines the two functions of vaporization and molecular dissociation. The apparatus operates at peak efficiency, is easy to assemble and disassemble for maintenance, and is inexpensive to operate, as compared to prior source cells. The apparatus of the invention is particularly effective in vaporizing and cracking chemical elements for use in deposition processes during semiconductor device fabrication. The apparatus can also be easily upgraded for larger quantities of chemical material without any consequential change in design.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for vaporizing and cracking a chemical material, comprising:

providing a vaporization and cracker cell apparatus comprising:

a vaporization cell having a heating chamber for holding a chemical material;

a heat source disposed in the heating chamber; and a thermal cracker cell communicatively connected to an outlet of the vaporization cell, the cracker cell including an elongated tube with a heating element associated therewith, the tube having a passageway with a diameter of a first dimension that narrows to a smaller second dimension by way of a tapering section in the tube, the tapering section located distally apart from an inlet of the tube, the smaller second dimension of the tube being substantially maintained from the tapering section to an exit opening of the tube;

placing a preselected amount of a chemical material into the heating chamber;

heating the chemical material in the heating chamber to a first temperature sufficient to vaporize the chemical material;

directing the vaporized chemical material to the elongated tube; and heating the vaporized chemical material along the smaller second dimension of the passageway in the elongated tube to a higher second temperature sufficient to dissociate molecular clusters of vaporized chemical material.

2. The method of claim 1, further comprising directing the dissociated chemical material from the exit opening of the elongated tube to a vacuum chamber for deposition on a substrate.

3. The method of claim 2, wherein the substrate comprises a semiconductor material.

4. The method of claim 1, wherein the chemical material comprises a solid or liquid material.

5. The method of claim 1, wherein the chemical material is selected from the group consisting of phosphorus, arsenic, antimony, and combinations thereof.

6. The method of claim 1, further comprising monitoring the temperature in the heating chamber, and adjusting the temperature in the heating chamber for optimal vaporizing conditions.

7. The method of claim 1, wherein the elongated tube comprises a quartz tube.

8. The method of claim 1, wherein the heat source is a light bulb or a quartz lamp mounted within the heating chamber.

9. The method of claim 1, wherein the vaporization cell includes a valve section with an in-line valve for selectively sealing the heating chamber from the passageway in the tube.

10. The method of claim 1, wherein the chemical material is held by a container in the heating chamber.

11. The method of claim 1, further comprising monitoring the temperature in the heating chamber by a thermocouple device disposed in the vaporization cell.

12. The method of claim 1, wherein the heating element of the cracker cell comprises a heating coil disposed around an outside surface of the tube.

13. A method for vaporizing and cracking a chemical material, comprising:

providing a vaporization and cracker cell apparatus comprising:

a vaporization cell including an inlet section in communication with a valve section defining a heating chamber;

a quartz container disposed in the heating chamber for holding a chemical material;

a heat source positioned in the heating chamber adjacent to the container;

a thermal cracker cell communicatively and removably connected to an outlet of the vaporization cell, the cracker cell including an elongated quartz tube having a passageway with a diameter of a larger first dimension that narrows to a smaller second dimension by way of a tapering section in the tube, the tapering section located distally apart from an inlet of the tube, the smaller second dimension of the tube being substantially maintained from the tapering section to an exit opening of the tube;

an in-line valve disposed in the valve section for selectively sealing the heating chamber from the passageway in the tube; and a heating coil disposed around an outside surface of the tube toward the exit opening;

placing a preselected amount of a chemical material into the heating chamber;

heating the chemical material in the heating chamber to a first temperature sufficient to vaporize the chemical material;

directing the vaporized chemical material to the elongated tube; and heating the vaporized chemical material along the smaller second dimension of the passageway in the elongated tube to a higher second temperature sufficient to dissociate molecular clusters of vaporized chemical material.

14. The method of claim 13, wherein the chemical material is selected from the group consisting of phosphorus, arsenic, antimony, and combinations thereof.

15. The method of claim 13, further comprising monitoring the temperature in the heating chamber by a thermocouple device disposed in the vaporization cell.

16. The method of claim 15, wherein the thermocouple device is operatively connected to a control device for monitoring and adjusting the temperature in the heating chamber.

17. The method of claim 16, wherein the heat source is operatively connected to a power source in operative communication with the control device.

18. The method of claim 17, wherein the heating coil is electrically connected to the power source.

19. The method of claim 13, wherein the exit opening of the tube is in sealing communication with a vacuum chamber.

* * * * *

UNITED STATES PATENT AND TRADEMARK OFFICE
CERTIFICATE OF CORRECTION

PATENT NO.    : 6,592,831 B2
DATED         : July 15, 2003
INVENTOR(S)   : Ruey-Jen Hwu, Laurence P. Sadwick and Paul P. Lee It is certified that error appears in the above-identified patent and that said Letters Patent is hereby corrected as shown below:

Title page,
Item [56], References Cited, OTHER PUBLICATIONS, change "york" to -- York --, after "DyP/GaAs," insert -- DyAs/GaAs, --

Signed and Sealed this

Eleventh Day of November, 2003

JAMES E. ROGAN
*Director of the United States Patent and Trademark Office*